US009455383B2

(12) United States Patent
Sugimoto et al.

(10) Patent No.: US 9,455,383 B2
(45) Date of Patent: Sep. 27, 2016

(54) MOLDED PACKAGE FOR LIGHT EMITTING DEVICE AND LIGHT EMITTING DEVICE USING THE SAME

(71) Applicant: NICHIA CORPORATION, Anan-shi, Tokushima (JP)

(72) Inventors: Kunihito Sugimoto, Anan (JP); Keisuke Sejiki, Tokushima (JP)

(73) Assignee: NICHIA CORPORATION, Anan-Shi, Tokushima (JP)

( * ) Notice: Subject to any disclaimer, the term of this patent is extended or adjusted under 35 U.S.C. 154(b) by 0 days.

(21) Appl. No.: 13/932,096

(22) Filed: Jul. 1, 2013

(65) Prior Publication Data

US 2014/0008692 A1 Jan. 9, 2014

(30) Foreign Application Priority Data

Jul. 4, 2012 (JP) ................................. 2012-150428
Jun. 25, 2013 (JP) ................................. P2013-132958

(51) Int. Cl.
*H01L 33/64* (2010.01)
*H01L 33/54* (2010.01)
*H01L 33/62* (2010.01)
(Continued)

(52) U.S. Cl.
CPC ............. *H01L 33/54* (2013.01); *H01L 21/565* (2013.01); *H01L 33/62* (2013.01); *H01L 33/641* (2013.01); *H01L 33/486* (2013.01); *H01L 2224/16225* (2013.01); *H01L 2924/19105* (2013.01); *H01L 2924/19107* (2013.01)

(58) Field of Classification Search
CPC ................. H01L 24/40; H01L 24/433; H01L 24/49579; H01L 24/49586; H01L 24/52; H01L 2023/4018; H01L 2023/405; H01L 21/67144; H01L 33/54; H01L 33/641; H01L 33/62; H01L 33/486; H01L 21/565; H01L 2924/19105; H01L 2924/19107; H01L 2224/16225
USPC .................. 257/99, 666, 675, 712, 717, 718
See application file for complete search history.

(56) References Cited

U.S. PATENT DOCUMENTS

2004/0262717 A1* 12/2004 Arndt et al. .................. 257/666
2005/0269591 A1 12/2005 Hsin Chen et al.
2006/0103012 A1* 5/2006 Chin ............................. 257/712

(Continued)

FOREIGN PATENT DOCUMENTS

JP          3109109 U      3/2005
JP       2007-116078 A     5/2007

(Continued)

OTHER PUBLICATIONS

Machine translation of JP 2007-116078, translated May 12, 2015.*

*Primary Examiner* — Zandra Smith
*Assistant Examiner* — Lauren R Bell
(74) *Attorney, Agent, or Firm* — Squire Patton Boggs (US) LLP

(57) ABSTRACT

A molded package, comprising: a molded resin having a recess for accommodating a light emitting element; a ceramic substrate disposed in a bottom of the recess, the ceramic substrate having one surface exposed from the bottom of the recess and the other surface exposed from a rear surface of the molded resin; and a lead disposed at a lower part of the molded resin, the light emitting element being mounted on the one surface of the ceramic substrate, the lead being in contact with at least one side surface of the ceramic substrate to hold the ceramic substrate.

18 Claims, 9 Drawing Sheets

(51) Int. Cl.
*H01L 21/56* (2006.01)
*H01L 33/48* (2010.01)

(56) References Cited

U.S. PATENT DOCUMENTS

| | | |
|---|---|---|
| 2007/0064131 A1 | 3/2007 | Sawanobori et al. |
| 2007/0246729 A1* | 10/2007 | Park .............................. 257/99 |
| 2012/0206934 A1* | 8/2012 | Kim ...................... H01L 25/167 362/602 |

FOREIGN PATENT DOCUMENTS

| | | | |
|---|---|---|---|
| JP | 2007116078 A | * | 5/2007 |
| JP | 2007-250979 A | | 9/2007 |
| KR | 20080079745 A | | 9/2008 |

* cited by examiner

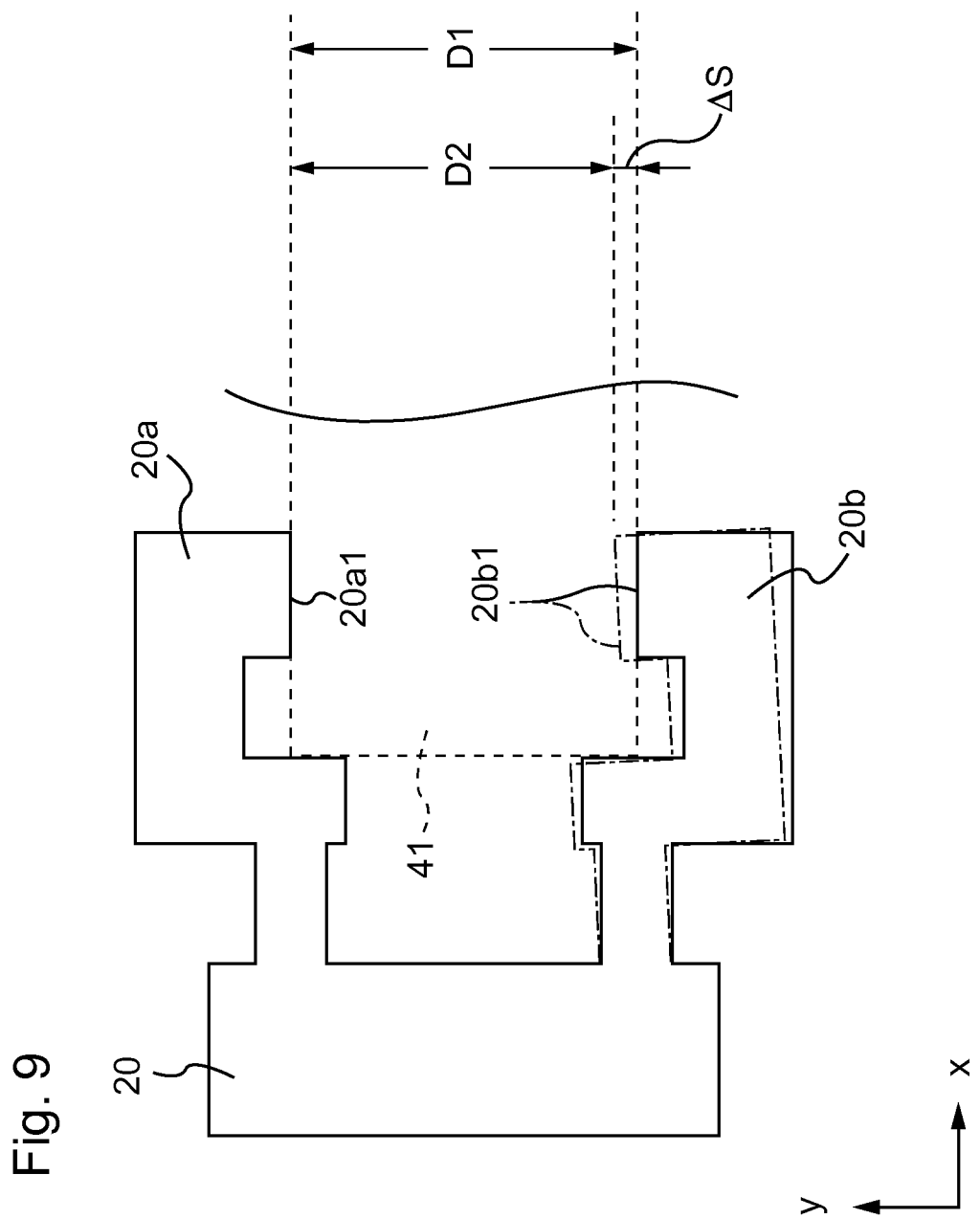

MOLDED PACKAGE FOR LIGHT EMITTING DEVICE AND LIGHT EMITTING DEVICE USING THE SAME

BACKGROUND OF THE INVENTION

1. Field of the Invention

The present invention relates to a molded package for a light emitting device, and a light emitting device using the same.

2. Description of the Related Art

Light emitting devices with a light emitting element, such as a LED, employs a ceramic package for effectively dissipating heat generated from the light emitting element. The ceramic package is a package including a ceramic substrate with a printed wiring on an upper surface thereof, and a circular resin wall rising from the upper surface of the ceramic substrate. The printed wiring includes a wiring for mounting the light emitting element, and a wiring for power feeding. The resin wall is disposed to enclose the wiring for mounting the light emitting element, and has a function of directing light from the light emitting element.

Ceramic has high heat conductivity as compared to general resin for packages, so that the ceramic package has excellent heat dissipation properties.

The ceramic used in the ceramic package has the excellent heat dissipation properties, but is expensive as compared to resin. Thus, a light emitting device using the ceramic package also becomes expensive. In order to reduce the amount of ceramic used, a package including a small-sized ceramic member embedded in a resin package is used to manufacture a light emitting device (Registered Utility Model No. 3109109 (Unity Opto Technology Co., Ltd.) and JP 2007-250979 A (Zeniya Industry Co., Ltd.)).

For example, Registered Utility Model No. 3109109 (Unity Opto Technology Co., Ltd.) discloses a solid semiconductor light emitting element (light emitting device) includes a ceramic heatsink block having a protruding mount cup with a light emitting element (chip) mounted thereon, and a coupling base formed by insert-molding a lead frame with resin. The lead frame includes a first sub-lead, a second sub-lead having the same shape as that of the first sub-lead, and a third sub-lead having a through hole and coupled to the first sub-lead. The coupling base has another through hole in a position corresponding to the third sub-lead. The mount cup of the heatsink block is fitted into the through hole of the coupling base, which integrates the heatsink block and the coupling base together.

The resin material (hereinafter referred to as a "resin protrusion") is protruded around the through hole of the coupling base so as to cover the third sub-lead to be abutted against the side surface of the mount cup of the heatsink block.

JP 2007-250979 A (Zeniya Industry Co., Ltd.) discloses a light emitting diode package with a reflection cup formed of a white resin around a lead frame integrated with the surface of a heat dissipation ceramic by brazing. The light emitting element (LED) is mounted on the lead frame, or on the heat dissipation ceramic exposed from the lead frame.

In the light emitting device disclosed in Registered Utility Model No. 3109109 (Unity Opto Technology Co., Ltd.) and JP 2007-250979 A (Zeniya Industry Co., Ltd.), the light emitting element is mounted on the ceramic member, which can effectively dissipate the heat generated from the light emitting element via the ceramic member. Upon mounting the light emitting device on a mounting board, a lead of a resin package can be used to mount the light emitting device by reflow soldering.

In the technique disclosed in Registered Utility Model No. 3109109 (Unity Opto Technology Co., Ltd.), the first sub-lead and the second sub-lead are exposed to the outside (at a ring-like recess) with respect to the resin protrusion provided around the through hole of the coupling base. The third sub-lead is covered with the resin protrusion. Thus, in order to perform wire-bonding on a chip to the sub-lead, a long wire leading from the protruded mount cup to the ring-like recess is necessary. However, the long wire is likely to be broken in sealing with a seal resin or the like, or increases the amount of wire used, which is not preferable.

In the technique disclosed in JP 2007-250979 A (Zeniya Industry Co., Ltd.), the ceramic and lead frame are heated at high temperature (for example, 760° C.) when fixing the heat dissipation ceramic to the lead frame by brazing. Thereafter, during cooling, the lead frame contracts more than the ceramic due to a difference in thermal expansion coefficient. The lead frame largely contracts to pull the ceramic from both side surfaces, which might cause cracks. In order to prevent the cracks, a relatively soft lead frame having hardness Hv of 40 to 80 is preferably used. The soft lead, however, warps largely in heating, and might be peeled out of a molding resin, which makes it to industrially use the soft lead.

SUMMARY OF THE INVENTION

Thus, an object of the present invention is to provide a molded package for a light emitting device that can shorten the length of a wire required for wire bonding, and a molded package for a light emitting device that can use a relatively hard lead. Further, it is another object of the present invention to provide a light emitting device using the molded package.

A first molded package according to the present invention includes:

a molded resin having a recess for accommodating a light emitting element;

a ceramic substrate disposed in a bottom of the recess, the ceramic substrate having one surface exposed from the bottom of the recess and the other surface exposed from a rear surface of the molded resin; and a lead disposed at a lower part of the molded resin, the light emitting element being mounted on the one surface of the ceramic substrate, the lead being in contact with at least one side surface of the ceramic substrate to hold the ceramic substrate.

A second molded package according to the present invention includes:

a molded resin having a recess for accommodating a light emitting element;

a ceramic substrate disposed in a bottom of the recess, the ceramic substrate having one surface exposed from the bottom of the recess and the other surface exposed from a rear surface of the molded resin; and a first lead and a second lead disposed at a lower part of the molded resin so as to put the ceramic substrate therebetween in a first direction, a part of one of surfaces of each of the first and second leads is exposed from the bottom of the recess, the light emitting element being mounted on the one surface of the ceramic substrate, at least one of the first lead and second lead being in contact with each of a pair of opposed side surfaces of the ceramic substrate in a second direction perpendicular to the first direction to hold the ceramic substrate between parts thereof.

In the first molded package of the invention, the lead of the molded package is in contact with the side surface of the ceramic substrate to hold the ceramic substrate, whereby the ceramic substrate and the lead are not bonded to each other. Even if temperature is changed, the ceramic substrate is not pulled out by the lead toward both sides of the substrate. Thus, the harder lead, for example having a hardness exceeding Hv 80 can be used.

In the second molded package of the invention, each of the first lead and the second lead has a part of one surface thereof serving as an exposed surface exposed from the bottom of the recess. Thus, a distance between the light emitting element mounted in the recess and each of the exposed surfaces of the first and second leads exposed within the recess can be decreased to thereby shorten the length of a wire required for wire bonding. In the second molded package, at least one of the first and second leads of the molded package is in contact with the pair of the opposed side surfaces of the ceramic substrate to hold the ceramic substrate between the parts thereof, whereby the ceramic substrate and the first and second leads are not bonded to each other. Even if temperature is changed, the ceramic substrate is not pulled out by the lead toward both sides of the substrate. Thus, the harder lead, for example having a hardness exceeding Hv 80 can be used.

A light emitting device according to the invention includes:
the first or second molded package of the invention described above;
a light emitting device accommodated in the recess of the molded resin of the molded package, and mounted on one surface of the ceramic substrate; and
a seal resin for sealing the recess.

Thus, the first molded package of the invention and the light emitting device using the first molded package can use the relatively hard lead.

Further, the second molded package of the invention and the light emitting device using the second molded package can shorten the length of the wire required for the wire bonding, and thus can use the relatively hard lead.

BRIEF DESCRIPTION OF THE DRAWINGS

FIGS. 1A to 1D show a light emitting device according to a first embodiment of the invention, in which FIG. 1A is a top view of the light emitting device, FIG. 1B is a cross-sectional view thereof taken along line A-A of FIG. 1A, FIG. 1C is a cross-sectional view thereof taken along line B-B of FIG. 1A, and FIG. 1D is a bottom view thereof;

FIGS. 3A to 3D show a modified example of the light emitting device in the first embodiment, in which FIG. 3A is a top view of the light emitting device, FIG. 3B is a cross-sectional view thereof taken along line A'-A' of FIG. 3A, FIG. 3C is a cross-sectional view thereof taken along line B'-B' of FIG. 3A, and FIG. 3D is a bottom view thereof;

FIG. 9 illustrates a lead experiencing elastic deformation, according to an embodiment.

DETAILED DESCRIPTION OF THE PREFERRED EMBODIMENTS

Figure 1A:
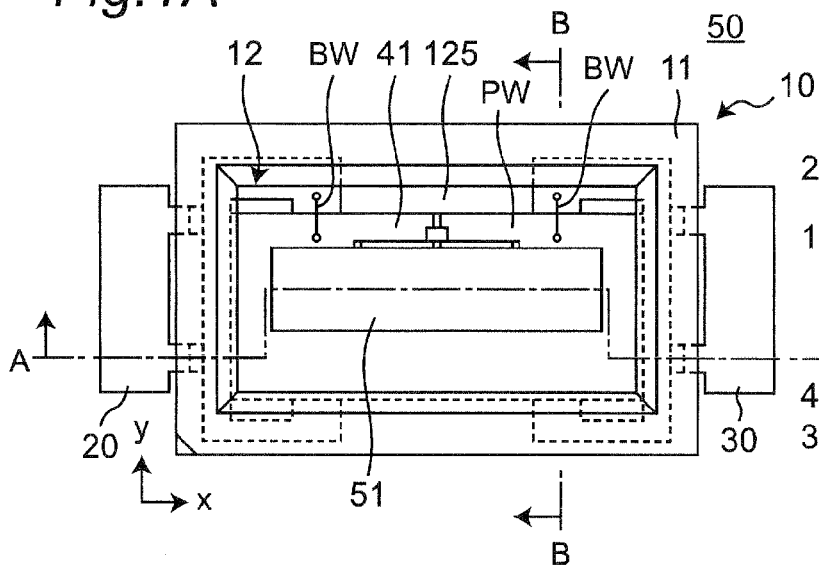

Some preferred embodiments of the invention will be described in detail below with reference to the accompanying drawings. In the following description, terms indicative of a specific direction or position (for example, "upper", "lower", "right", "left", and other words containing these terms) will be used if necessary. These terms are used for easy understanding of the invention with reference to the accompanying drawings, and are not intended to restrict the technical scope of the invention by the meanings thereof. The same parts or members are indicated by the same reference characters represented in the drawings.

<First Embodiment>

A light emitting device 50 of this embodiment includes a molded package 10, a light emitting element 42, a seal resin 52, and a wavelength conversion member 51 as shown in FIG. 1.

The molded package 10 includes a molded resin 11 with a recess 12, a ceramic substrate 41 disposed at a bottom part 125 of the recess 12 of the molded resin 11, and a first lead 20 and a second lead 30.

The light emitting element 42 is accommodated in a recess 12 of the molded resin 11, and mounted on a front surface 41a of the ceramic substrate 41. In the light emitting device 50 of this embodiment, the ceramic substrate 41 is rectangular extending in the direction X, and four light emitting elements 42 are arranged on the semiconductor substrate in one line in the direction X (see FIG. 1B). When the line A-A of FIG. 1A is a straight line, the leads 20 and 30 and the light emitting element 42 cannot be illustrated together in the cross-sectional view of FIG. 1B. For easy understanding of the invention, the line A-A of FIG. 1A is bent to pass through the leads 20 and 30 and the light emitting element 42, so that FIG. 1B can show both the leads 20 and 30 and the light emitting element 42.

The wavelength conversion member 51 is a member formed of glass or resin containing material that converts the wavelength of light emitted from the light emitting element 42 (fluorescent member or the like). In this embodiment, the wavelength conversion member is disposed on the four light emitting elements 42 (see FIGS. 1A to 1C).

Figure 1D:
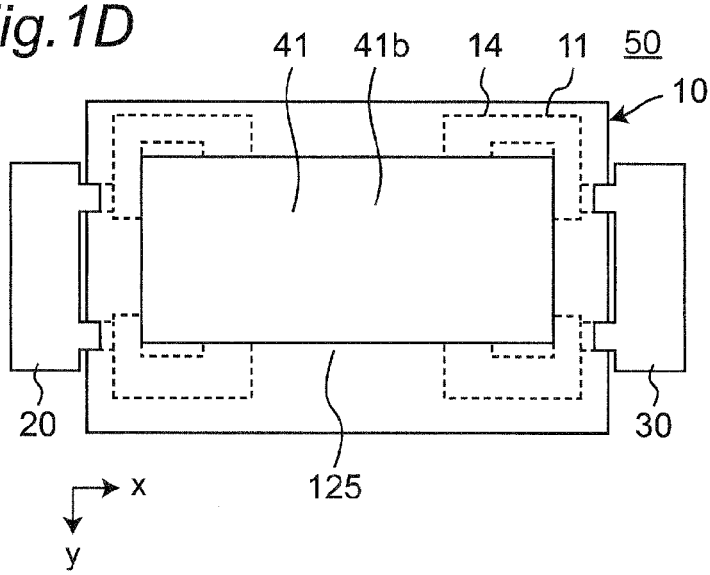
Figure 2:
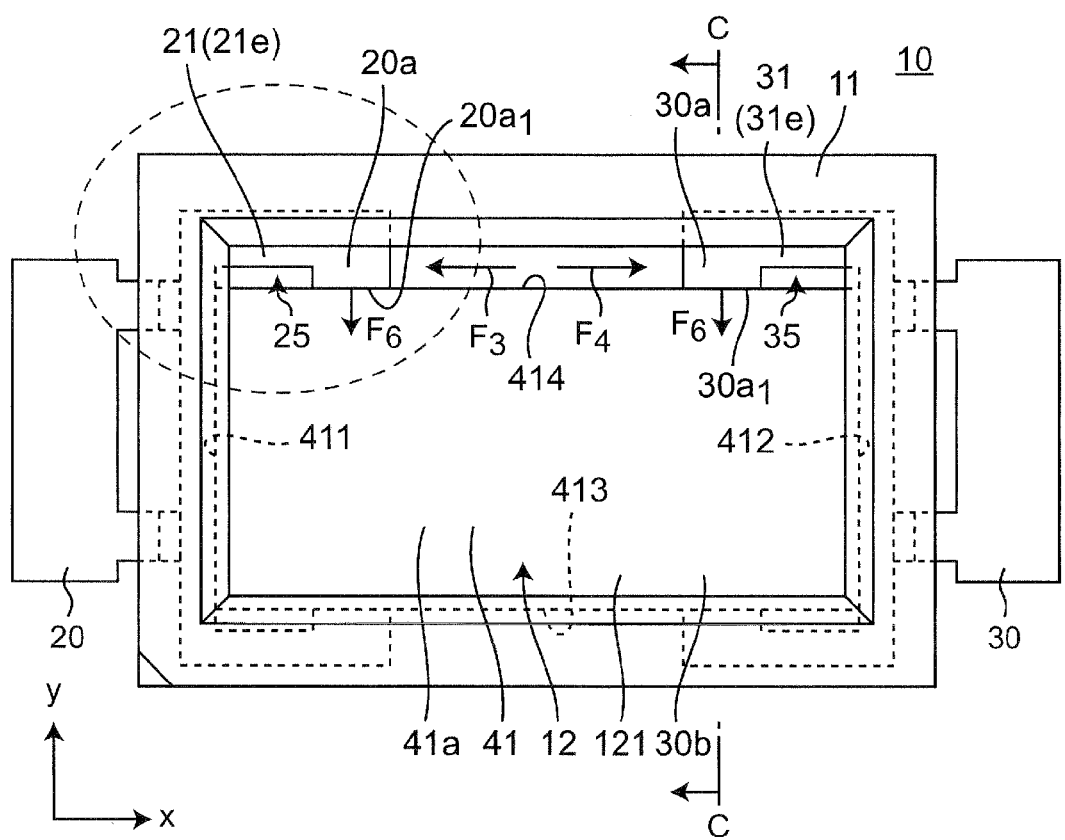
FIG. 2 is a top view of a molded package.

FIG. 2 shows the molded package 10 of this embodiment. The ceramic substrate 41 disposed at the bottom part 125 of the recess 12 of the molded resin 11 has a part of one surface (front surface) 41a exposed from a bottom 121 of the recess 12 of the molded resin 11. The other surface (rear surface) 41b of the ceramic substrate 41 is exposed from a rear surface 14 of the molded resin 11 as shown in FIG. 1D.

Turning back to FIG. 2, a part of the first lead 20 is disposed within the molded resin 11, and has enough joint strength to the molded resin 11. Likewise, apart of the second lead 30 is also disposed within the molded resin 11, and has enough joint strength to the molded resin 11.

Figure 1C:
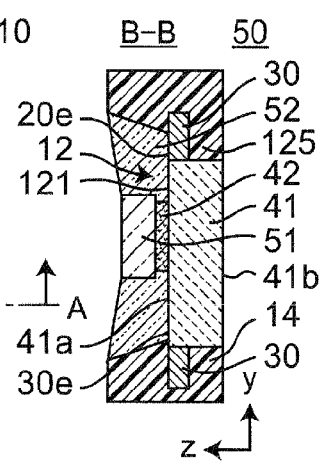
Figure 1B:
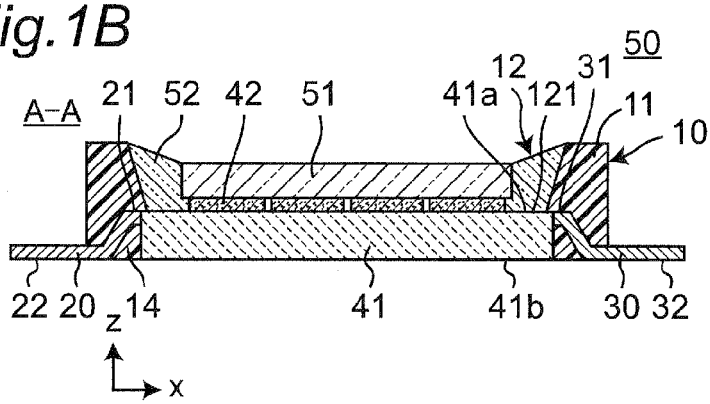

As shown in FIGS. 1B, 1C, and 2, the side surfaces 411 to 414 of the ceramic substrate 41 are in contact with the first lead 20 and the second lead 30. As shown in the figure, the first lead 20 is in contact with three side surfaces of the ceramic substrate 41 (first side surface 411, third side surface 413, and fourth side surface 414) of the ceramic substrate 41. The second lead 30 is also in contact with three side surfaces of the ceramic substrate 41 (second side surface 412, third side surface 413, and fourth side surface 414) of the ceramic substrate 41. The invention, however, is not limited thereto. At least one of the first and second leads 20 and 30 has only to be in contact with at least one side surface of the four side surfaces 411 to 414 of the ceramic substrate 41.

In the invention, the ceramic substrate 41 has the four side surfaces 411 to 414 thereof enclosed by the molded resin 11. In the related-art, the resin material has a small adhesive force to the ceramic material, which can cause the ceramic substrate 41 to falloff the molded resin body 11. Thus, it is necessary to bond the ceramic substrate 41 and the molded resin 11 with an adhesive or the like so as to prevent falling of the ceramic substrate 41 off.

In the technique disclosed in JP 2007-250979 A (Zeniya Industry Co., Ltd.), brazing is required to position a lead frame at an upper surface of the heat dissipation ceramic. During cooling after the brazing, the lead frame pulls the ceramic from both side surfaces due to a difference in thermal expansion coefficient therebetween, which might cause cracks in the ceramic. When a relatively soft lead frame with a hardness of Hv 40 to 80 is used in order to prevent the cracks, the ceramic substrate might be peeled from the molded resin.

In the invention, when at least one of the first and second leads 20 and 30 is in contact with at least one side surface of the ceramic substrate 41, the lead 20 or 30 is stuck in the side surfaces 411 to 414, which can suppress falling of the ceramic substrate 41 off the molded resin 11. Accordingly, the invention can avoid the use of the adhesive or the like between the ceramic substrate 41 and the molded resin 11. Even if temperature is changed, the ceramic substrate is prevented from being pulled by the leads toward both sides. Thus, the harder lead, for example having a hardness exceeding Hv 80 can be used.

At least one of the first lead 20 and the second lead 30 is preferably in contact with each of a pair of opposed side surfaces of the ceramic substrate 41 to hold the ceramic substrate 41 between parts thereof, which can effectively suppress falling of the ceramic substrate 41 off the molded resin 11.

The first lead 20 and the second lead 30 may be disposed so as to put the ceramic substrate 41 therebetween in the first direction (in the direction x).

For example, as shown in FIG. 2, among side surfaces 411 to 414 of the ceramic substrate 41, the first side surface 411 and the second side surface 412 are opposed to each other in the first direction (in the direction x), while the third side surface 413 and the fourth side surface 414 are opposed to each other in a second direction (in the direction y) perpendicular to the first direction.

In the invention, at least one of the first lead 20 and the second lead 30 (both leads in the embodiment shown in FIGS. 1 and 2) can be in contact with the third side surface 413 and the fourth side surface 414 of the ceramic substrate 41 opposed to each other in the direction y to hold the ceramic substrate 41 between parts of at least one of the first lead 20 and the second lead 30. That is, the direction (direction y) in which the first lead 20 and the second lead 30 put the ceramic substrate 41 therebetween may be perpendicular to the direction (direction x) in which the first lead 20 and the second lead 30 hold the ceramic substrate 41 between parts thereof.

Specifically, as shown in FIG. 2A, the first lead 20 can be branched into two parts in the direction y to extend in the direction x. One of the two parts branched (first branch extending portion 20a) can be in contact with the fourth side surface 414 of the ceramic substrate 41, and the other (second branch extending portion 20b) can be in contact with the third side surface 413. Likewise, the second lead 30 can be vertically branched into two parts to extend in the direction X. One of the two parts branched (first branch extending portion 30a) can be in contact with the fourth side surface 414 of the ceramic substrate 41, and the other (second branch extending portion 30b) can be in contact with the third side surface 413.

The first lead 20 disposed at the lower part of the molded package 10 preferably has a part of one surface (front surface) 21 exposed from the bottom 121 of the recess 12 (exposed surface 21e). Likewise, the second lead 30 disposed at the lower part of the molded package 10 also preferably has a part of one surface (front surface) 31 exposed from the bottom 121 of the recess 12 (exposed surface 31e). Two electrodes of the light emitting element 42 and the first and the second lead 20, 30 can be connected by bonding wires BW within the recess 12.

Figure 3A:
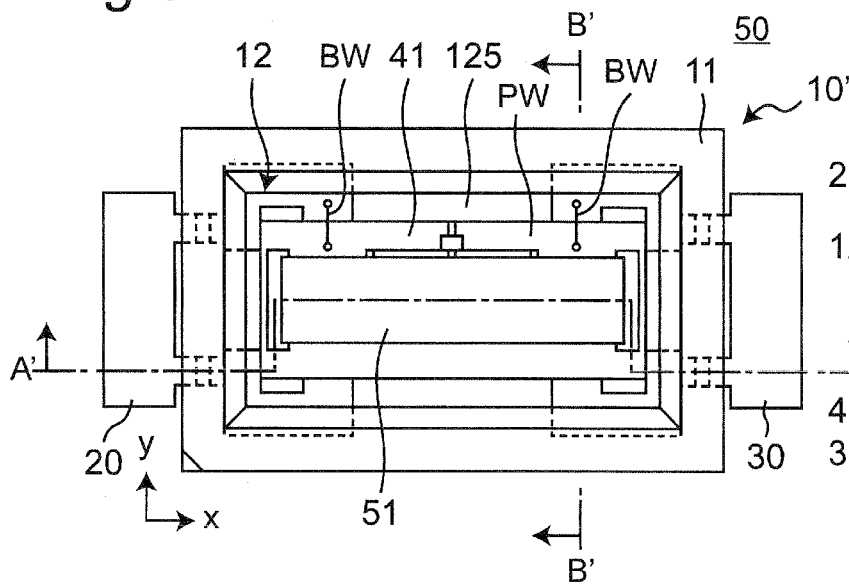
Figure 3C:
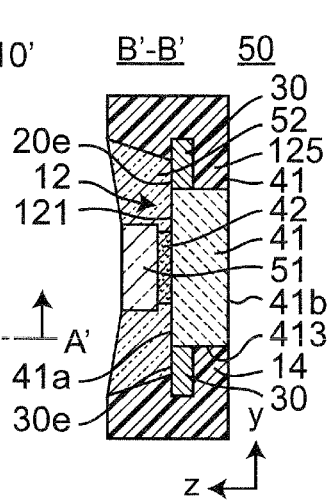
Figure 3B:
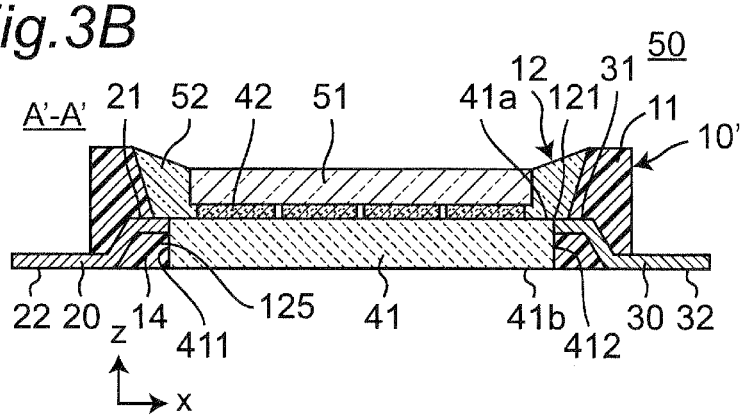
Figure 3D:
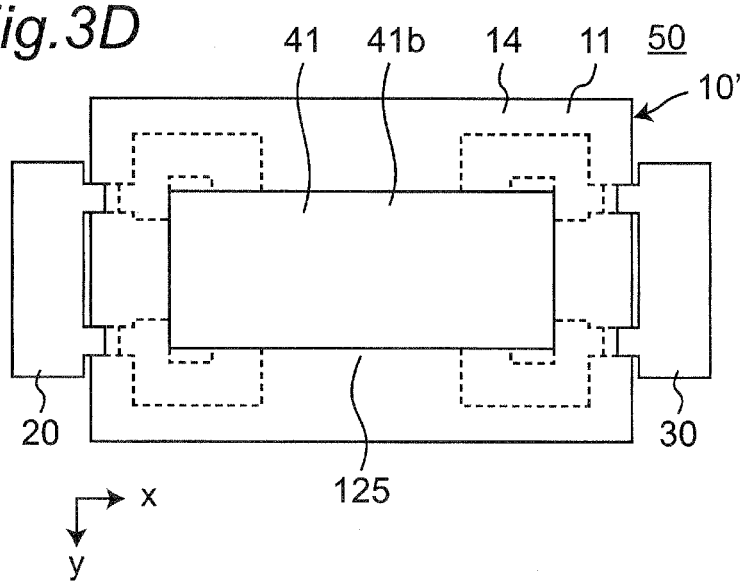

As shown in FIG. 1A, when the ceramic substrate 41 has a printed wiring PW on its front surface 41a, the light emitting element 42 is flip-chip mounted on the printed wiring PW (see FIG. 3B). Two terminals of the printed wiring PW, and the first lead 20 and the second lead 30 can be bonded together by the bonding wires BW within the recess 12 (see FIG. 1A).

In any cases, the bonding wire BW is tacked across only in the recess 12, so that the length of the bonding wire BW can be shorten as compared to the technique disclosed in cited reference 1. In particular, the use of the printed wiring PW can get the terminals of the printed wiring PW close to the first lead 20 and the second lead 30 regardless of the mounting position of the light emitting element 42, which can further shorten the length of the binding wire BW.

At least one of the first lead 20 and the second lead 30 of the molded package is only in contact with at least one side surface of the ceramic substrate 41 (or in some cases, in contact with a pair of the opposed side surfaces 413 and 414 of the ceramic substrate 41 to hold the ceramic substrate between parts thereof in the direction Y). Even if the amount of contraction of the first lead 20 and the second lead 30 during cooling is larger than that of the ceramic substrate 41, the ceramic substrate 41 never is pulled toward both side surfaces.

In the technique disclosed in cited reference 2, in order to release a tensile stress applied to the ceramic, the lead is manufactured of material having a low hardness. As a result, the lead is likely to be peeled from the molded resin, which causes another problem. In contrast, in the invention, since the ceramic is not subjected to the tensile stress, the leads 20 and 30 can be manufactured of material having enough hardness, which can suppress the peeling of the leads 20 and 30 from the molded resin 11 due to the hardness of the leads 20 and 30.

At least one of the first lead 20 and the second lead 30 may be in contact with the third side surface 413 and the fourth side surface 414 of the ceramic substrate 41 opposed to each other in the direction y to hold the ceramic substrate 41 between parts thereof. In this case, there is an effect to suppress the peeling at an interface between the ceramic substrate 41 and the molded resin 11, and another effect to effectively suppressing falling of the ceramic substrate 41 off the molded package 10.

In the molded package 10 shown in FIG. 2, a part of the front surface 41a of the ceramic substrate 41 is exposed from the bottom 121 of the recess 12 of the molded resin 11, and a remaining part of the front surface 41a (three edges among four edges of the ceramic substrate 41 as shown in the figure) is covered by the molded resin 11. In this embodiment, a contact area between the ceramic substrate 41 and the molded resin 11 is increased, which is useful for increasing the bonding force between the ceramic substrate 41 and the molded resin 11.

Each of the exposed surfaces 21e and 31e of the first lead 20 and the second lead 30 can be provided in the vicinity of one edge exposed from the bottom 121 of the recess 12 of the molded resin 11 among the four edges of the ceramic substrate 41.

(Modified Examples)

FIGS. 3 and 4 show a modified example of the molded package (molded package 10'). The molded package 10' differs from the molded package 10 shown in FIGS. 1 and 2 in that the entire front surface 41a of the ceramic substrate 41 is exposed from the bottom 121 of the recess 12 of the molded resin 11. In the molded package 10' in the modified example, the ceramic substrate 41 is surrounded by the molded resin 11 at the bottom 121 of the recess 12. In exposing the first lead 20 and the second lead 30 are exposed from the bottom 121 of the recess 12, the first and second leads 20 and 30 can be exposed from an arbitrary position of the molded resin 11 enclosing the ceramic substrate 41. That is, in the molded package 10', the exposed surfaces 21e and 31e of the leads 20 and 30 can be disposed at the vicinity of any edge of the ceramic substrate 41. When coupling two electrodes of the light emitting element 42 disposed on the ceramic substrate 41 to the first lead 20 and the second lead 30 by the bonding BW, the exposed surfaces 21e and 31e can be provided in an arbitrary position so as to minimize the length of the bonding wire BW.

FIGS. 3 and 4 show an example in which the first lead 20 and the second lead 30 are in contact with the side surfaces 411 to 414 of the ceramic substrate 41. However, even when the first lead 20 and the second lead 30 are apart from the side surfaces 411 to 414 of the ceramic substrate 41, the exposed surfaces 21e and 31e can be provided near an arbitrary edge of the ceramic substrate 41, which can provide the effect of shortening the bonding wire BW.

The effect of the first lead 20 will be described below on the assumption that the first lead 20 is in contact with the third side surface 413 and the fourth side surface 414 to hold the ceramic substrate 41 between parts thereof.

The resin material forming the molded resin 11 has a thermal expansion coefficient which is several times higher than that of ceramic forming the ceramic substrate 41. Thus, when the molded package 10 is subjected to high temperature (for example, when the light emitting device 50 using the molded package 10 is mounted by reflow soldering, or when the light emitting device 50 is used) to cause the thermal expansion of the molded resin 11, the ceramic substrate 41 does not catch up with the thermal expansion. This might result in peeling of an interface between the molded resin 11 and the ceramic substrate 41. When the interface is peeled in the reflow soldering, a solder flux or the like might invade the recess 12 of the molded resin 11 to absorb light from the light emitting element 42. Further, when the interface is peeled in use of the light emitting device 50, moisture from external atmosphere can invade the recess 12 of the molded resin 11, which might degrade the light emitting element 42.

When the peeling of the interface progresses, the ceramic substrate 41 might be fallen off the molded package 10.

In the invention, the first lead 20 made of metal is in contact with the third side surface 413 and the fourth side surface 414 of the ceramic substrate 41 opposed to each other to hold the ceramic substrate 41 between parts thereof. Specifically, the first branch extending portion 20a of the first lead 20 is in contact with the fourth side surface 414, and the second branch extending portion 20b is in contact with the third side surface 413. The metal material forming the first lead 20 has a thermal expansion coefficient similar to that of the ceramic, as compared to the resin material. At a temperature for the reflow soldering (of about 200° C.), there is a small difference between the thermal expansion amount of the first lead 20 and that of the ceramic substrate 41. Also when the molded package 10 is subjected to high temperature by the reflow soldering or the like, the contact of the first lead 20 with the third side surface 413 and the fourth side surface 414 of the ceramic substrate 41 can be maintained. That is, the ceramic substrate 41 is held by the first lead 20, which can prevent falling of the ceramic substrate 41 off the molded package 10.

Figure 4A:
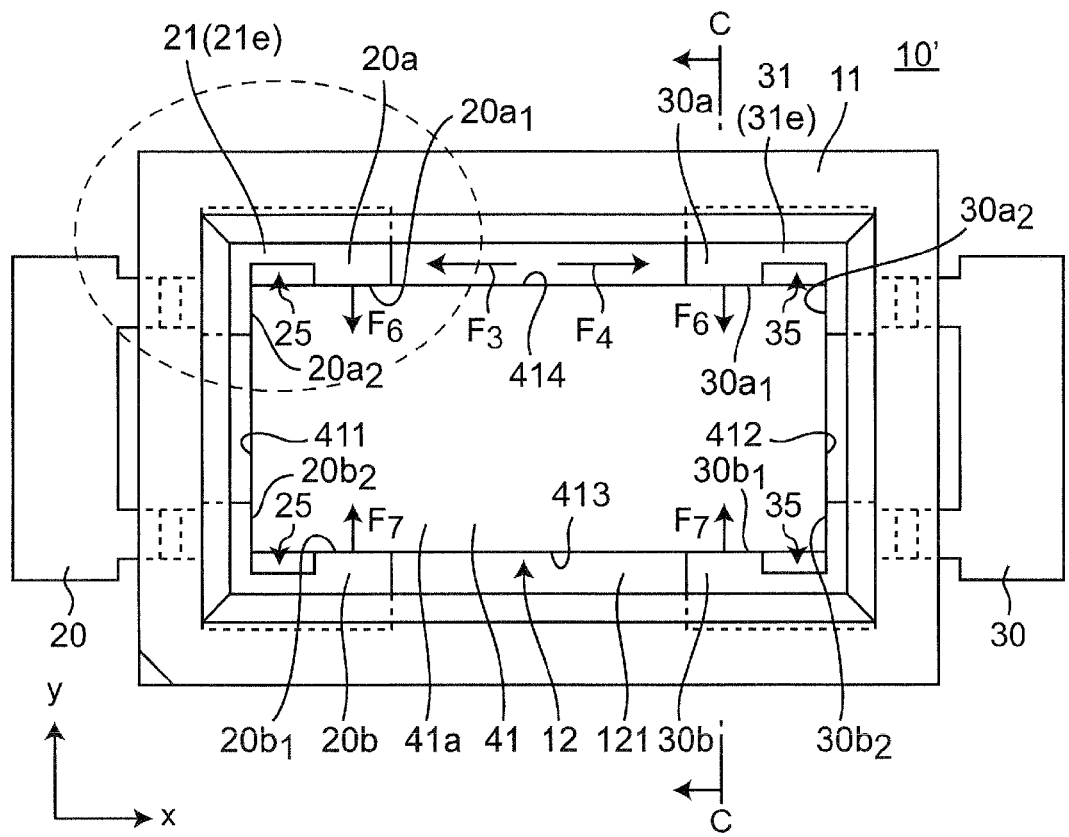
FIG. 4A is a top view of the molded package.

In observing the local stress, when the light emitting device 50 is subjected to the high temperature, the molded resin 11 between the first branch extending portion 20a of the first lead 20 and the first branch extending portion 30a of the second lead 30 expands to apply a stress $F_3$ to the first branch extending portion 20a of the first lead 20 in the direction −X (see FIG. 4A). Likewise, the molded resin 11 between the second branch extending portion 20b of the first lead 20 and the second branch extending portion 30b of the second lead 30 expands to apply a stress to the second branch extending portion 20b of the first lead 20 in the direction −X (not shown). The stress $F_3$ applied to the first branch extending portion 20a is substantially the same level in the same direction as the stress applied to the second branch extending portion 20b. Thus, the first branch extending portion 20a and the second branch extending portion 20b can desirably exhibit the equal resistance against the stress in the direction −x.

In the invention, the first branch extending portion 20a and the second branch extending portion 20b hold the ceramic substrate 41 therebetween in the direction (direction y) perpendicular to the direction −x, so that the first and second branch extending portions 20a and 20b can exhibit the same resistance against the stress in the direction −x.

Likewise, when the light emitting device 50 is subjected to the high temperature, the molded resin 11 between the first branch extending portion 20a of the first lead 20 and the first branch extending portion 30a of the second lead 30 expands to apply a stress $F_4$ to the first branch extending portion 30a of the second lead 30 in the direction X (see FIG. 4A). Likewise, the molded resin 11 between the second branch extending portion 20b of the first lead 20 and the second branch extending portion 30b of the second lead 30 expands to apply a stress to the second branch extending portion 30b of the second lead 30 in the direction −x direction (not shown). The stress $F_4$ applied to the first branch extending portion 30a is substantially the same level in the same direction as the stress applied to the second branch extending portion 30b. Thus, the first branch extending portion 30a and the second branch extending portion 30b can desirably exhibit the equal resistance against the stress in the direction x.

In the invention, the first branch extending portion 30a and the second branch extending portion 30b hold the ceramic substrate 41 therebetween in the direction (direction y) perpendicular to the direction x, so that the first and second branch extending portions 30a and 30b can exhibit the same resistance against the stress in the direction x.

The first lead 20 serves as a reinforcing material of the molded resin 11 positioned therearound. The first lead 20 has a part thereof located within the molded resin 11, and has enough joint strength to the molded resin 11. When the light emitting device 50 is exposed to the heat, the amount of expansion of the first lead 20 is set smaller than that of the molded resin 11, and thus serves to suppress the expansion of the molded resin 11. As a result, it is suppressed to peel the molded resin 11 from the ceramic substrate 41 (due to expansion) around the first lead. This arrangement can suppress the invasion of the flux soldering and moisture from the peeled interface into the recess 12 of the molded resin 11.

In the above description, the first lead 20 is in contact with the third side surface 413 and the fourth side surface 414 of the ceramic substrate 41 to hold the ceramic substrate 41 between parts thereof. However, instead of the first lead 20, the second lead 30 is in contact with the third side surface 413 and the fourth side surface 414 to hold the ceramic substrate 41 between parts thereof, which provides the same effects. In particular, both the first lead 20 and the second lead 30 are preferably in contact with the third side surface 413 and the forth side surface 414 of the ceramic substrate 41, which can improve the effect of suppressing the falling of the ceramic substrate 41 and the effect of suppressing the pilling of the interface between the ceramic substrate 41 and the molded package 10.

The molded package 10 of the invention has only to have the ceramic substrate 41 with the substantially same size as that of the light emitting element 42, and thus can reduce the used amount of the expensive ceramic substrate 41 as compared to the related-art ceramic package. The invention can reduce the cost of the molded package 10, and further can suppress the cost of the light emitting device 50 using the molded package 10.

In the molded package 10 of the invention, the light emitting element 42 is mounted on the ceramic substrate 41 with high heat conductivity. Thus, the heat generated from the light emitting element 42 in use can be effectively dissipated from the rear surface 41b of the ceramic substrate 41 (exposed to the rear surface of the molded resin 11) toward the outside of the molded package 10 through the ceramic substrate 41. The first lead 20 and/or second lead 30 in contact with the ceramic substrate 41 can also be a heat dissipation route.

The ceramic substrate 41 is held, for example, between the first branch extending portion 20a and the second branch extending portion 20b of the first lead 20, so that the position of the ceramic substrate 41 in the direction y can be determined by the branch extending portions 20a and 20b.

Instead of the first lead 20, the ceramic substrate 41 is held between the first branch extending portion 30a and the second branch extending portion 30b of the second lead 30, so that the position of the ceramic substrate 41 in the direction y can be determined by the branch extending portions 30a and 30b.

In this way, the ceramic substrate 41 is held between parts of the first lead 20 and/or second lead 30 in the direction y, whereby the position of the ceramic substrate 41 in the direction y can be easily aligned with high accuracy in manufacturing the molded package 10.

Both the first lead 20 and second lead 30 preferably held the ceramic substrate 41 between parts thereof in the direction y, which improves the accuracy of positioning of the ceramic substrate 41 in the direction y.

Figure 4B:
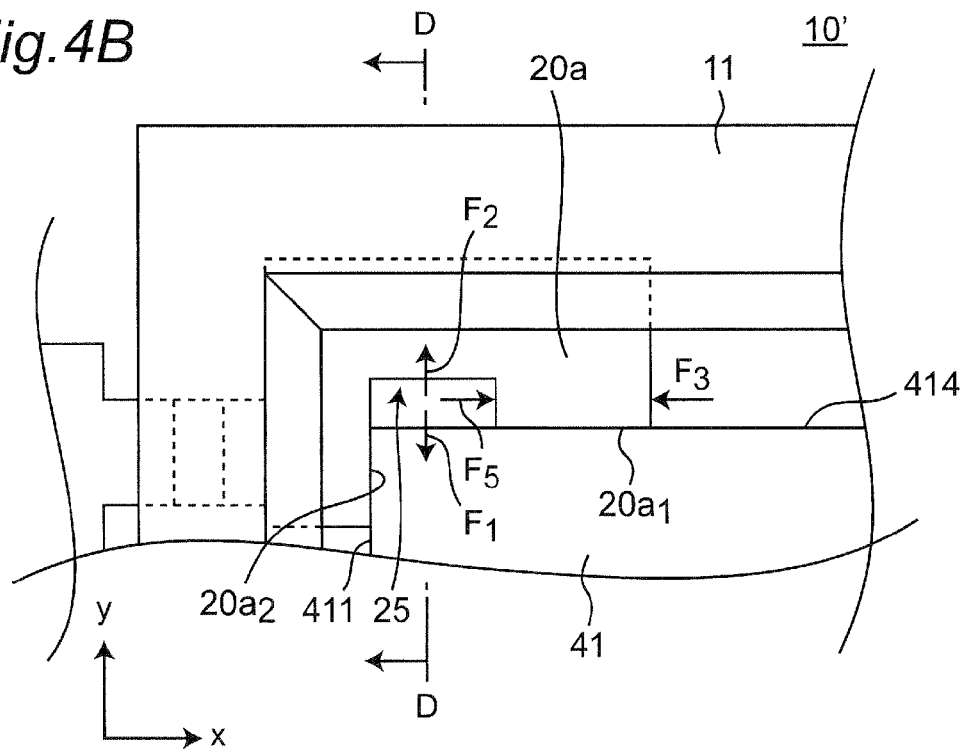
FIG. 4B is a partial enlarged top view of FIG. 4A.

The first lead 20 is preferably in contact with a side surface (first side surface 411 shown in FIG. 4A) other than the third side surface 413 and the fourth side surface 414 of the ceramic substrate 41. For example, as shown in FIG. 4B, the first branch extending portion 20a of the first lead 20 is preferably in contact with not only the fourth side surface 414, but also the first side surface 411. In this way, the first lead 20 is in contact with the first side surface 411, whereby the position of the ceramic substrate 41 in the direction x can be easily aligned with high accuracy in manufacturing the molded package 10.

Instead of the first branch extending portion 20a, the second branch extending portion 20b is in contact with not only the third side surface 413, but also with the first side surface 411 (see FIG. 4A), which can easily position the position of the ceramic substrate 41 in the direction x with higher accuracy.

Instead of the first lead 20, even when the second lead 30 is in contact with a side surface other than the third side surface 413 and the fourth side surface 414 of the ceramic substrate 41 (second side surface 412 shown in FIG. 4A), the same effects can be obtained. For example, even when the first branch extending portion 30a of the second lead 30 is in contact with not only the fourth side surface 414, but also the second side surface 412, the position of the ceramic substrate 41 in the direction x can be easily aligned with higher accuracy.

Instead of the first branch extending portion 30a, the second branch extending portion 30b is in contact with not only the third side surface 413 but also the second side surface 412, whereby the position of the ceramic substrate 41 in the direction x can be easily aligned with higher accuracy.

From the viewpoint of positioning the ceramic substrate 41 in the direction x, any one of the first branch extending portion 20a, and the second branch extending portion 20b of the first lead 20, and the first branch extending portion 30a and the second branch extending portion 30b of the second lead 30 may be in contact with the first side surface 411 or second side surface 412 of the ceramic substrate 41. In order to achieve the positioning with higher accuracy, however, a plurality of branch extending portions are preferably in contact with the side surfaces. Particularly, all the branch extending portions 20a, 20b, 30a, and 30b are more preferably in contact with the side surfaces.

The first lead 20 preferably includes parts (first contact portions $20a_1$ and $20b_1$) in contact with the third side surface 413 and the fourth side surface 414 of the ceramic substrate 41, parts (second contact portions $20a_2$ and $20b_2$) in contact with a side surface (first side surface 411 shown in FIG. 4A) other than the above side surfaces and cutout portions 25 provided between the first contact portions $20a_1$ and $20b_1$ and the second contact portions $20a_2$ and $20b_2$) and filled with resin. For example, as shown in FIG. 4B, the first branch extending portion 20a of the first lead 20 includes the first contact portion $20a_1$ in contact with the fourth side surface 414, the second contact portion $20a_2$ in contact with the first side surface 411, and a cutout portion positioned between these contact portions. The cutout portion 25 is preferably filled with resin. The thermal expansion of the resin filling in the cutout portion 25 generates the stress $F_1$ (force to push the ceramic substrate 41) and the stress $F_2$ (force to push the first branch extending portion 20a) along the direction y.

The first branch extending portion 20a and the second branch extending portion 20b are integrally formed with each other and the first lead 20 can be formed of a relatively hard material, whereby a separation distance between the first contact portion $20a_1$ of the first branch extending portion 20a and the first contact portion $20b_1$ of the second branch extending portion 20b is kept substantially constant. The first contact portion $20b_1$ of the second branch extending portion 20b is in contact with the third side surface 413 of the ceramic substrate 41 (see FIG. 4A), which prevents the entire first lead 20 from moving in the direction y with respect to the ceramic substrate 41. Thus, the first branch extending portion 20a is not moved in the direction y. Thus, the resin filling in the cutout portion 25 is pushed toward the ceramic substrate 41 by the stress $F_1$, which increases the degree of adhesion between the resin and the fourth side surface 414 of the ceramic substrate 41. In this way, the resin fills in the cutout portion 25, which can suppress the peeling of the interface between the ceramic substrate 41 and the resin.

As shown in FIG. 4A, the resin positioned between the first branch extending portion 20a of the first lead 20 and the first branch extending portion 30a of the second lead 30 generates the stresses $F_3$ and $F_4$ in the opposite directions along the direction x by thermal expansion. Such stresses promote the peeling of the interface between the fourth side surface 414 of the ceramic substrate 41 and the resin.

In contrast, as shown in FIG. 4B, when the resin filling in the cutout portion 25 thermally expands, the stress $F_5$ is generated along the direction x. As a result, the stresses $F_3$ and $F_5$ in the opposed directions along the direction y are partially compensated at the first branch extending portion 20a, which suppresses the peeling of the interface between the fourth side surface 414 of the ceramic substrate 41 and the resin.

Figure 6:
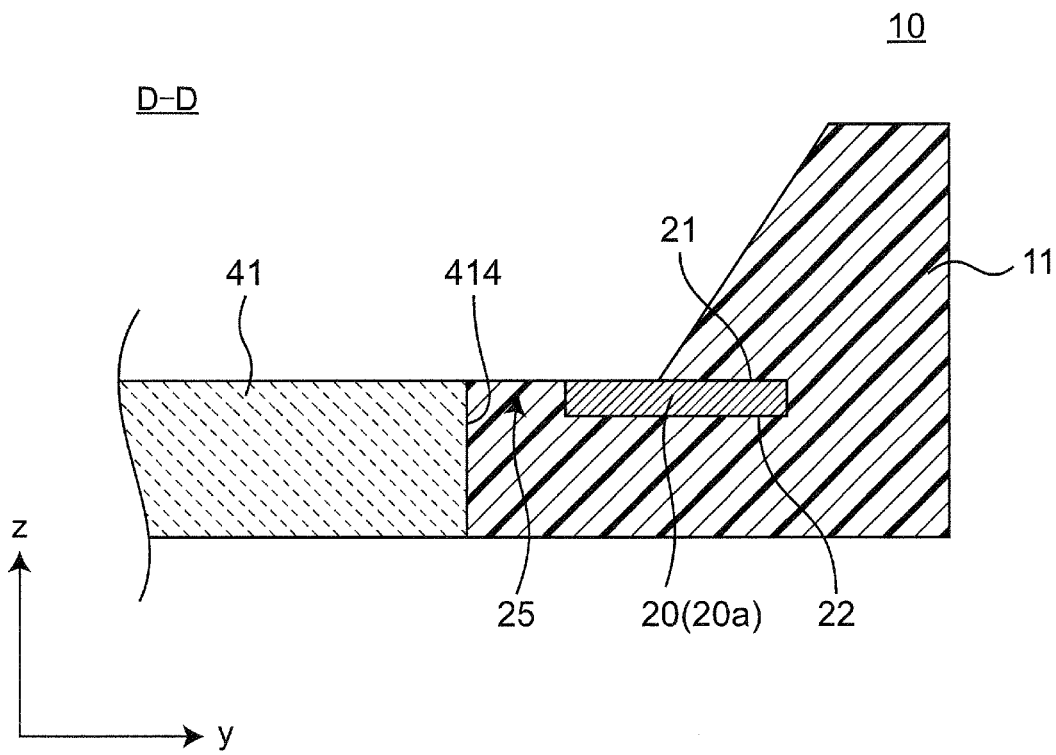
FIG. 6 is a cross-sectional view taken along line D-D of FIG. 4B.

When the resin is formed up to the lower side of the first lead 20 as shown in FIG. 6, the resin filling in the cutout portion 25 can be integrally formed with the molded resin 11. The first lead 20 has its both side surfaces, a lower surface 22, and a part of an upper surface 21 covered with the molded resin 11 to improve the adhesion between the molded resin 11 and the first lead 20.

The cutout portion 25 is provided in the first branch extending portion 20a of the first lead 20, which has been described above in detail, but the cutout portion 25 can be provided in another branch extending portion.

For example, with reference to FIG. 4A, the second branch extending portion 20b of the first lead 20 includes the first contact portion $20b_1$ in contact with the third side surface 413, the second contact portion $20b_2$ in contact with the first side surface 411, and the cutout portion 25 positioned therebetween. The cutout portion 25 can be filled with resin. For example, the first branch extending portion 30a of the second lead 30 includes the first contact portion $30a_1$ in contact with the fourth side surface 414, the second contact portion $30a_2$ in contact with the second side surface 412, and the cutout portion 35 positioned therebetween. The cutout portion 35 can be filled with resin. For example, the second branch extending portion 30b of the second lead 30 includes the first contact portion $30b_1$ in contact with the third side surface 413, the second contact portion $20b_2$ in contact with the second side surface 412, and the cutout portion 35 positioned therebetween. The cutout portion 35 can be filled with resin.

Even when the cutout portions 25 and 35 are provided in any branch extending portion, the same effects can be obtained.

As shown in FIG. 9, the first lead 20 preferably holds the ceramic substrate 41 parts thereof with elastically deformed. As used herein, "elastically deformed" means that the first lead 20 holds the ceramic substrate 41 between parts thereof, thereby causing elastic deformation of the first lead 20. Specifically, a separation distance (first separation distance $D_1$) between the parts of the first lead 20 for holding the ceramic substrate 41 (between the "first contact portion $20a_1$" of the first branch extending portion 20a and the "first contact portion $20b_1$" of the second branch extending portion 20b) when the first lead 20 holds the ceramic substrate 41 therebetween, is longer than the separation distance (second separation distance $D_2$) therebetween when the first lead 20 does not hold the ceramic substrate 41 therebetween; that is, $D_1 > D_2$. In other words, in this embodiment, after removing the ceramic substrate 41 from the first lead 20, the separation distance between the first contact portion $20a_1$ of the first branch extending portion 20a and the first contact portion $20b_1$ of the second branch extending portion 20b becomes shorter. Thus, the first lead 20 can generate an elastic force for holding the ceramic substrate 41 (see stresses $F_6$ and $F_7$ shown in FIG. 4A). Comparing to situation in which the first lead 20 is in simply contact with the side surfaces 413 and 414 of the ceramic substrate 41 (that is, without generating the stresses $F_6$ and $F_7$), falling of the ceramic substrate 41 off the molded package 10 can be effectively prevented.

Instead of the first lead 20, the second lead 30 holds the ceramic substrate 41 between parts thereof with elastically deformed, which can achieve the same effects.

In particular, the first lead 20 and the second lead 30 hold the ceramic substrate 41 between parts of each of the first and second leads with elastically deformed, which is more preferable in effect of suppressing falling of the ceramic substrate 41.

A specific method for generating the elastic force involves lessening a separation distance (corresponding to the above "second separation distance $D_2$") between the first contact portion $20a_1$ of the first branch extending portion 20a and the first contact portion $20b_1$ of the second branch extending portion 20b in manufacturing the first lead 20, as compared to the size of the ceramic substrate 41 (width of the ceramic substrate 41) in the direction y. How a difference in dimension (hereinafter referred to as a "Δs") between the width of the ceramic substrate 41 and the second separation distance $D_2$ is set can be determined based on the required elastic force, the properties of the metal used in the first lead 20, and the like. When a difference in thermal expansion amount between the first lead 20 and the ceramic substrate 41 might not be negligible (for example, when exposed to a high temperature exceeding the temperature for reflow soldering), the dimension difference "Δs" between the second separation distance $D_2$ and the ceramic substrate 41 is equal to or more than the difference in thermal expansion amount between the first lead 20 and the ceramic substrate 41, which can compensate for the difference in thermal expansion amount.

Turning back to FIG. 3B, the surfaces 21 and 31 of the first lead 20 and the second lead 30 are flush with the front surface 41a of the ceramic substrate 41 in the recess 12 of the molded resin 11. This easily exposes parts of the surfaces 21 and 31 of the leads 20 and 30 from a bottom 121 of the recess 12.

In contrast, outside the molded resin 11, the rear surfaces 22 and 32 of the first lead 20 and the second lead 30 are flush with the rear surface 41b of the ceramic substrate 41. Thus, when mounting the light emitting device 50 on the mounting board, the rear surfaces 22 and 32 of the leads 20 and 30 are in contact with the mounting board. In this way, the light emitting device 50 can be mounted on the mounting board by the reflow soldering.

The size (thickness) of the first lead 20 and the second lead 30 in the direction z is smaller than that of the ceramic substrate 41 in the direction z. In order to position the front surfaces 21 and 31 and the rear surfaces 22 and 32 of the leads 20 and 30 in the above manner, the leads 20 and 30 are bent to have the cross section in a z-like shape. The bent portion of each of the leads 20 and 30 can be embedded in the molded resin 11 shown in FIG. 3B, or can be positioned outside the molded resin 11.

The rear surfaces 22 and 32 of the leads 20 and 30 are not necessarily flush with the rear surface of the ceramic substrate 41. For example, the rear surfaces 22 and 32 of the leads 20 and 30 may be positioned slightly above the rear surface 41b of the ceramic substrate 41. Thus, the rear surface 41b of the ceramic substrate 41 can be surely in contact with the mounting board. The mounting board can serve as a heat dissipation route to improve the heat dissipation from the ceramic substrate 41. In mounting the light emitting element by the reflow soldering, even with a small gap between the rear surfaces 22 and 32 of the leads 20 and 30 and the mounting board, the gap can be filled with the soldering, which can achieve mounting of the element.

As described above, the surfaces 21 and 31 of the first lead 20 and the second lead 30 are flush with the front surface 41a of the ceramic substrate 41 in the recess 12 of the molded resin 11, but the invention is not limited thereto.

Figure 7A:
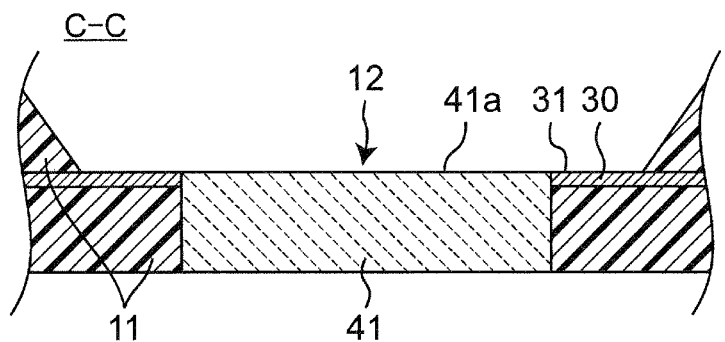
FIGS. 7A to 7D are cross-sectional views taken along line C-C of FIG. 4A.
Figure 7B:
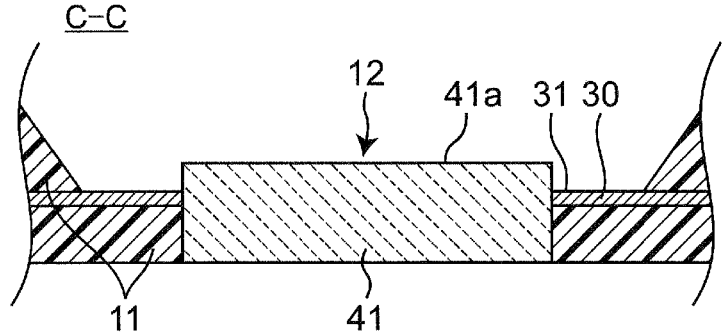

FIGS. 7A and 7B are cross-sectional views taken along line C-C across the second lead 30 of FIG. 4A. As shown in FIG. 7A, the front surface 31 of the second lead 30 can be flush with the front surface 41a of the ceramic substrate 41. As shown in FIG. 7B, a stepped portion can be provided between the front surface 31 of the second lead 30 and the front surface 41a of the ceramic substrate 41. The molded package 10 shown in FIG. 7A differs from the molded package 10 shown in FIG. 7B in die for use.

The molded resin 11 of the molded package 10 is molded using the die with a protrusion corresponding to the shape of the recess 12. As shown in FIG. 7A, when the front surface 31 of the second lead 30 is flush with the front surface 41a of the ceramic substrate 41, the die with a relatively simple shaped protrusion can be used.

In contrast, as shown in FIG. 7B, when a stepped portion is provided between the front surface 31 of the second lead 30 and the front surface 41a of the ceramic substrate 41, the die with a protrusion including recess and convex parts corresponding to the stepped portion is required to be used.

Figure 7C:
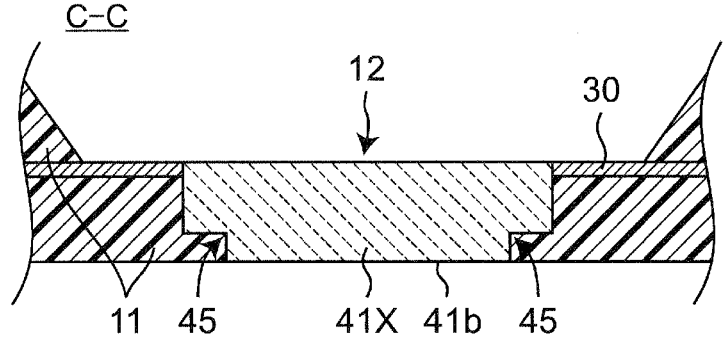

As shown in FIG. 7C, a ceramic substrate 41X with a stepped portion 45 on the rear surface 41b side can be used. By filling the stepped portion 45 with the molded resin 11, falling the ceramic substrate 41X off the molded package 10 can be effectively suppressed.

Figure 7D:
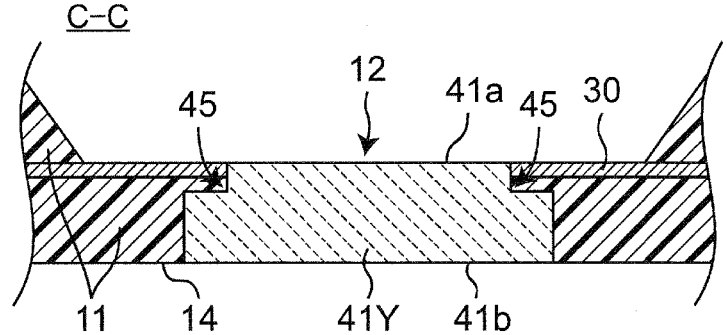
Figure 7D:
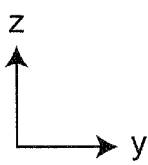

As shown in FIG. 7D, a ceramic substrate 41Y with a stepped portion 45 on the front surface 41a can be used. In this case, an area of the rear surface 41b of the ceramic substrate 41Y exposed from the rear surface 14 of the molded resin 11 can be formed widely, which can provide the molded package 10 with excellent heat dissipation properties.

A method for manufacturing the light emitting device 50 according to this embodiment will be described below.

<1. Manufacturing of Molded Package 10>

1-1. Formation of Lead Frame

A metal plate having a high hardness (for example, exceeding Hv 80) is punched to form a lead frame with a plurality of pairs of leads, each pair having the first lead 20 and second lead 30 opposed to each other in the direction x. The first lead 20 includes the first branch extending portion 20a and the second branch extending portion 20b which are separated from each other in the direction y. The second lead 30 includes the first branch extending portion 30a and the second branch extending portion 30b which are separated from each other in the direction y (see FIG. 4A). Preferably, a separation distance (second separation distance $D_2$) between the first contact portion $20a_1$ of the first branch extending portion 20a and the first contact portion $20b_1$ of the second branch extending portion 20b in the first lead 20 is substantially equal to or slightly less than the size (width) of the "ceramic substrate 41" formed in the next step. The same goes for the relationship between the width of the ceramic substrate 41 and the separation distance between the first contact portion $30a_1$ of the first branch extending portion 30a and the first contact portion $30b_1$ of the second branch extending portion 30b in the second lead 30.

The first lead 20 and the second lead 30 are connected to the lead frame by a tie bar.

1-2. Formation of Ceramic Substrate

Ceramic powder materials are compressed into a rectangular plate, and the thus-obtained compressed compact is sintered. Thereafter, a metal wiring is formed on the surface of the compact to form a printed wiring PW, which produces the ceramic substrate 41.

1-3. Arrangement of Ceramic Substrate

The ceramic substrate 41 is positioned between the first lead 20 and the second lead 30 which are opposed to each other. At this time, as shown in FIG. 4A, the ceramic substrate 41 is disposed between the first branch extending portion 20a and the second branch extending portion 20b of the first lead 20, whereby the first branch extending portion 20a is in contact with the fourth side surface 414 of the ceramic substrate 41, and the second branch extending portion 20b is in contact with the third side surface 413 of the ceramic substrate 41. In this way, the ceramic substrate 41 is positioned in the direction y. At this time, when the width of the ceramic substrate 41 is larger than the separation distance between the first branch extending portion 20a and the second branch extending portion 20b, the ceramic substrate 41 is held between thereof while the first and second branch extending portions 20a and 20b are elastically deformed.

In the form shown in FIG. 4A, the first and second branch extending portions 20a and 20b are also brought into contact with the first side surface 411 of the ceramic substrate 41. Thus, the ceramic substrate 41 is also positioned in the direction x.

Likewise, the ceramic substrate 41 is disposed between the first branch extending portion 30a and the second branch extending portion 30b of the second lead 30, whereby the first branch extending portion 30a is in contact with the fourth side surface 414 of the ceramic substrate 41, and the second branch extending portion 30b is in contact with the third side surface 413 of the ceramic substrate 41. At this time, when the width of the ceramic substrate 41 is larger than the separation distance between the first branch extending portion 30a and the second branch extending portion 30b, the ceramic substrate 41 is held between thereof while the first and second branch extending portions 30a and 30b are elastically deformed.

In the form shown in FIG. 4A, the first branch extending portion 30a and the second branch extending portion 30b are further in contact with the second side surface 412 of the ceramic substrate 41.

The positional relationship between the ceramic substrate 41 and the first lead 20 and the second lead 30 in the direction z can be determined arbitrarily. For example, as shown in FIG. 3B, the ceramic substrate 41 can be disposed such that the front surface 41a of the ceramic substrate 41, an exposed surface 21e of the first lead 20, and an exposed surface 31e of the second lead 30 are flush with each other.

The ceramic substrate 41 is temporarily fixed to the lead frame by the first lead 20 and the second lead 30.

1-4. Molding of Molded Resin 11

Figure 8A:
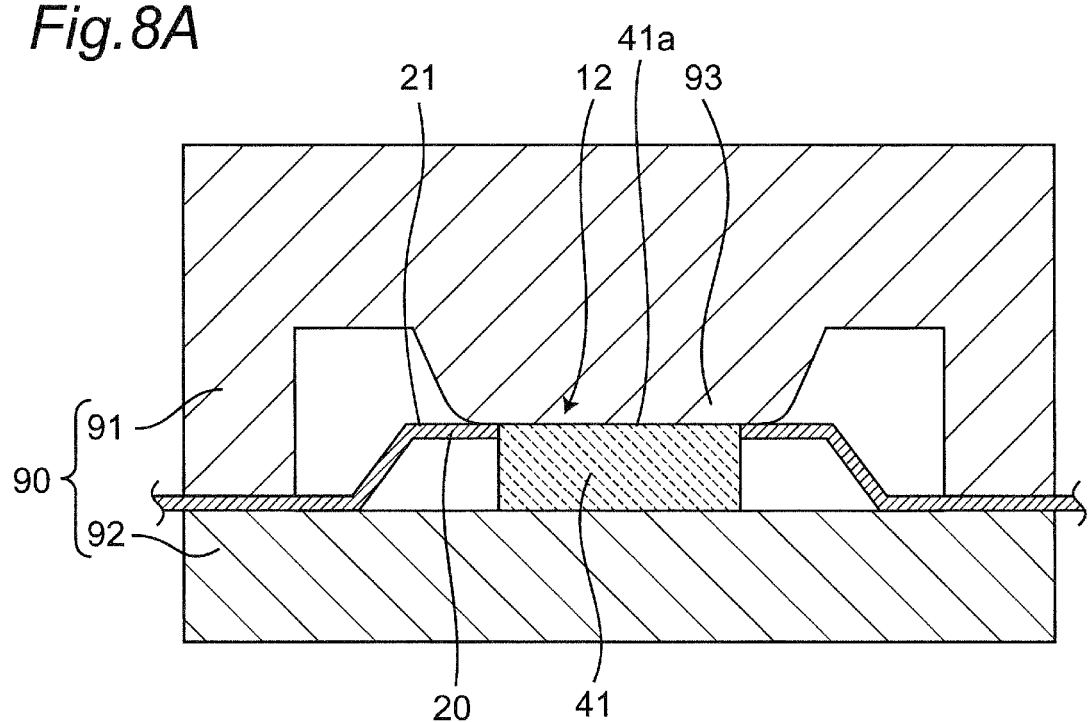
FIGS. 8A and 8B are cross-sectional view for explaining a method for manufacturing the molded package.
Figure 8B:
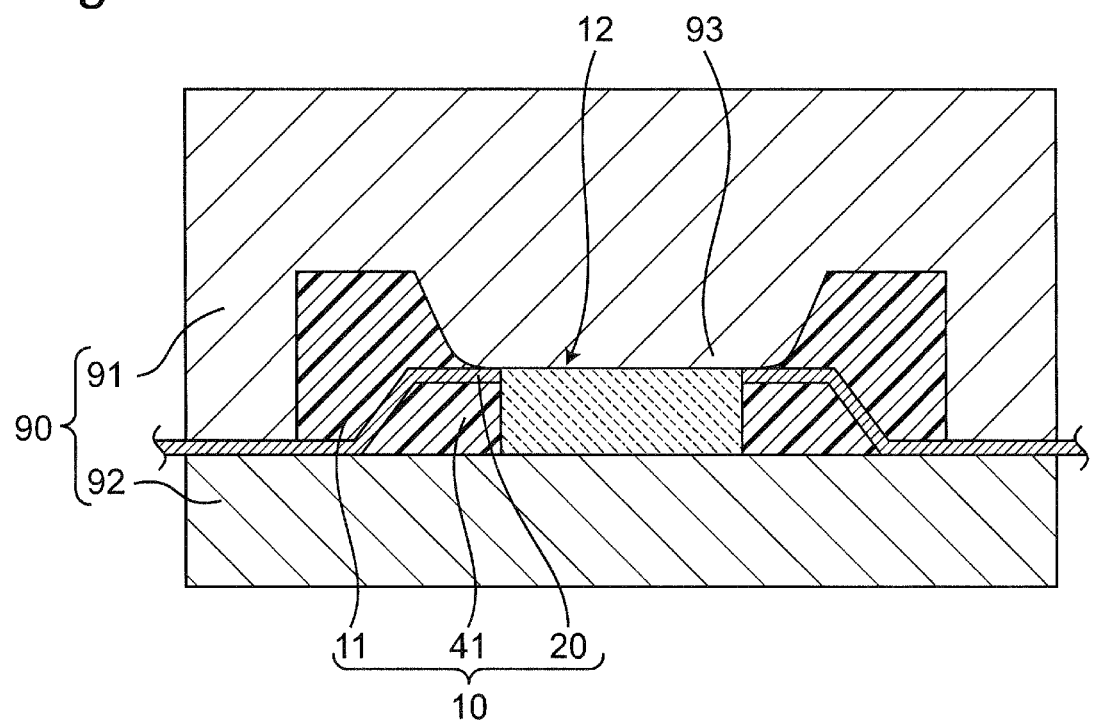

A lead frame LF is held by a die 90 having a hollow for molded resin 11 (see FIG. 8A). The ceramic substrate 41 temporarily fixed to the lead frame is held between a protrusion 93 of an upper die 91 and the lower die part 92. A part of the front surface 21 of the first lead 20 is in contact with the protrusion 93 (which leads to the exposed surface 21e to be described later). Although not shown in the figure, like the second lead 30, a part of the front surface 31 is in contact with the protrusion 93 (which leads to the exposed surface 31e to be described later). A resin material for the molded resin 11 is injected into the hollow of the die 90. After the resin material is cured and removed from the die 90, the molded package 10 fixed to the lead frame can be obtained.

<2. Mounting of Light Emitting Element 42>

The light emitting element 42 is flip chip mounted on the printed wiring PW on the ceramic substrate 41 of the molded package 10. First, a soldering bump is formed in the position on the printed wiring PW corresponding to an electrode of the light emitting element 42. Then, the light emitting element 42 is mounted on the ceramic substrate 41 such that the electrode of the light emitting element 42 is opposed to the printed wiring PW. At this time, the electrode of the light emitting element 42 and the soldering bump can be accurately positioned. In the example shown in FIG. 5B, four light emitting elements 42 are mounted. In the same way, the zener diode 43 is also mounted on the printed wiring PW of the ceramic substrate 41.

One terminal of the printed wiring PW is connected to the exposed surface 21e of the first lead 20 by bonding wire BW. The other terminal of the printed wire PW is connected to the exposed surface 31e of the second lead 30 by the bonding wire BW.

The wavelength conversion member 51 is fixed on the light emitting element 42 with resin.

<3. Filling of Seal Resin 52>

Seal resin in a liquid state is potted in the recess 12 of the molded package 10, and then cured. When the seal resin 52 is formed of two layers, first, a first seal resin (underfill) is potted in the recess 12, and then cured. Next, a second seal resin is potted into the recess 12, and then cured.

<4. Singulation of Light Emitting Device 50>

The tie bar of the lead frame is cut by dicing, so that each light emitting device 50 is separated from the original.

Each component of the light emitting device 50 will be described below.

(Ceramic Substrate 41)

The ceramic substrate 41 can be formed using ceramic, including AlN, $Al_2O_3$, SiC or the like. In particular, AlN preferably has high heat conductivity.

In this embodiment, the rectangular ceramic substrate 41 is taken as an example, but the ceramic substrate for use is not limited thereto and can be the ceramic substrate 41 with any shape, such as square, polygon, circle, and oval.

(First Lead 20 and Second Lead 30)

The first lead 20 and the second lead 30 can be formed using a conductive material containing one or more of aluminum, iron, nickel, copper, and the like. The first lead 20 and the second lead 30 are preferably plated with gold, silver, or an alloy thereof.

(Molded Resin 11)

Molding materials for molded resin 11 for use can include thermosetting resins such as an epoxy resin or a silicone resin, and thermoplastic resins such as a liquid crystal polymer, a polyphthalamide resin or a polybutylene terephthalate resin (PBT). White pigments such as titanium oxide are mixed into the molding material, which can increase the reflectance of light in the recess 12 of the molded resin 11.

(Light Emitting Element 42)

A semiconductor light emitting element (for example, LED) can be used as the light emitting element 42. The semiconductor light emitting element is formed of a laminated structure on the substrate. The laminated structure includes semiconductor layers containing a nitride semiconductor, such as InN, AlN, GaN, InGaN, AlGaN, or InGaAlN, a III-V group compound, and a II-VI group compound. The substrates for the light emitting element can include an insulating substrate made of sapphire, and a conductive substrate made of SiC, GaN, GaAs, or the like.

The semiconductor light emitting element using the insulating substrate has an n-type electrode and a p-type electrode formed on the upper surface of the laminated structure. The semiconductor light emitting element using the conductive substrate has one electrode (for example, n-type electrode) formed on the upper surface of the laminated structure, and the other electrode (for example, p-type electrode) formed on the lower surface of the conductive substrate.

Figure 5A:
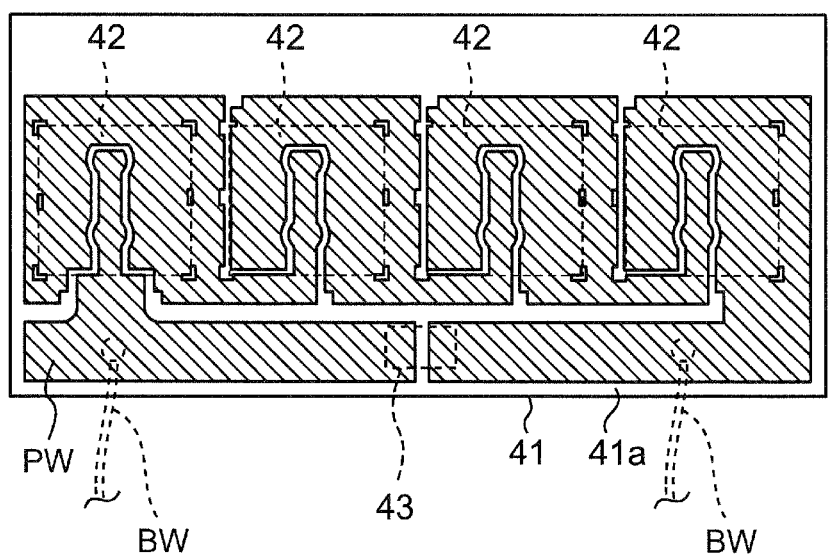
FIG. 5A is a top view of a ceramic substrate used in the molded package for the light emitting element.
Figure 5B:
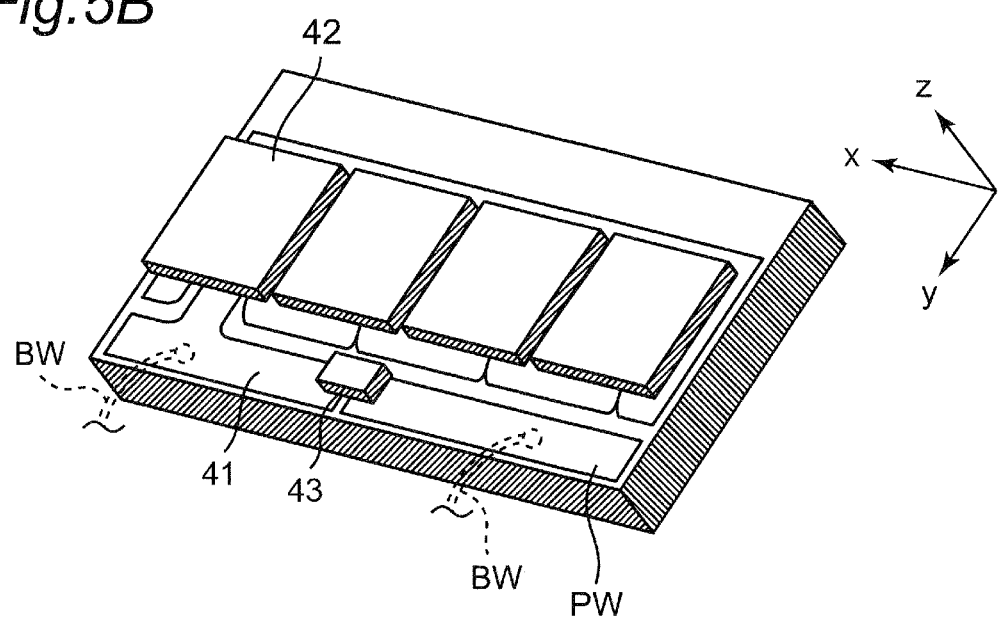
FIG. 5B is a perspective view showing the state of the ceramic substrate with the light emitting element and a Zener diode mounted thereon.

Referring to FIG. 5B, the semiconductor light emitting elements using the insulating substrate is mounted on the printed wiring of the ceramic substrate 41 by flip-chip bonding.

(Bonding Wire BW)

The bonding wire BW can be formed using a metal wire containing, for example, gold, silver, copper, platinum, or aluminum, or an alloy thereof.

(Seal Resin 52)

The seal resin 52 is to seal the recess 12 of the molded resin 11 for accommodating the light emitting element 42, and to protect the light emitting element 42 from external circumstance. The seal resin 52 can be formed of a single layer, but can also be formed of a plurality of layers (for example, two layers consisting of first seal resin 521 and second seal resin 522). Suitable materials for the seal resin for use can include a silicone resin, an epoxy resin, an acrylic resin, or one or more of them. It is also possible to disperse, in the seal resin 52, light-scattering particles formed of, for example, titanium oxide, silica dioxide, titanium dioxide, zirconium dioxide, alumina, aluminum nitride, and the like.

(Wavelength Conversion Member 51)

The wavelength conversion member 51 is a member formed of glass or resin containing material (fluorescent material) for converting the wavelength of light emitted from the light emitting element 42. In this embodiment, the wavelength conversion member is disposed on an upper surface of the light emitting element 42. For example, the light emitting device 50 for generating white light can use a combination of the light emitting element 42 for emitting blue light, and the wavelength conversion member 51 (for example, YAG glass formed of glass in which YAG dispersed) that absorbs the blue light to emit yellow light.

The present invention includes the following aspects.

First Aspect

A molded package including:

a molded resin having a recess for accommodating a light emitting element;

a ceramic substrate disposed at a lower part of the recess, the ceramic substrate having one surface exposed from a bottom of the recess and the other surface exposed from a rear surface of the molded resin; and a first lead and a second lead disposed at a lower part of the molded resin so as to put the ceramic substrate between the first and second leads in a first direction, each of the first and second leads having as an exposed part which is a part of one surface exposed from the bottom of the recess, the light emitting element being mounted on the one surface of the ceramic substrate, at least one of the first lead and second lead being in contact with each of a pair of opposed side surfaces of the ceramic substrate in a second direction perpendicular to the first direction to hold the ceramic substrate between parts thereof.

Second Aspect

In the molded package according to the first aspect, at least one of the first lead and the second lead is in contact with a side surface of the ceramic substrate other than the pair of the opposed side surfaces.

Third Aspect

In the molded package according to the first and second aspects, at least one of the first lead and the second lead includes first contact portions in contact with the pair of the opposed side surfaces of the ceramic substrate, a second contact portion in contact with the side surface of the ceramic substrate other than the pair of the opposed side surfaces, and a cutout portion provided in between the first contact portion and the second contact portion and filled with resin.

Fourth Aspect

In the molded package according to the first to third aspects, at least one of the first lead and the second lead holds the ceramic substrate between parts thereof with elastically deformed.

Fifth Aspect

A method for manufacturing the molded package according to the first to fourth aspects including:

forming a lead frame including a first lead and a second lead opposed to each other in a first direction;

disposing the ceramic substrate between the first lead and the second lead; and after the step of disposing, injecting resin into a die to form a molded resin while holding the first lead, the second lead, and the ceramic substrate by the die.

Sixth Aspect

In the method according to the fifth aspect, at least one of the first lead and the second lead includes two first contact portions each of which is in contact with each of a pair of opposed side surfaces of the ceramic substrate, a separation distance between the two first contact portions being smaller than the size of the ceramic substrate in a second direction perpendicular to the first direction.

Seventh Aspect

A light emitting device including:

a molded package described in the first to fourth embodiments;

a light emitting element mounted on one surface of the ceramic substrate and electrically connected to the first lead and the second lead; and a seal resin for sealing a recess of a molded resin accommodating the light emitting element.

Eighth Aspect

A molded package including:

a molded resin having a recess for accommodating a light emitting element;

a ceramic substrate disposed in a bottom of the recess of the molded resin, a whole of one surface of the ceramic substrate being exposed from the bottom of the recess, a whole or a part of the other surface being exposed from a rear surface of the molded resin; and a lead disposed at a lower part of the molded resin so as to expose a part of one surface thereof from the bottom of the recess, the light emitting element being mounted on the one surface of the ceramic substrate.

Ninth Aspect

In the molded package according to the eighth aspect, the lead is in contact with at least one side surface of the ceramic substrate to hold the ceramic substrate.

Tenth Aspect

In the molded package according to the eighth and ninth aspects, the lead is in contact with each of a pair of the opposed side surfaces of the ceramic substrate to hold the ceramic substrate between parts thereof.

Eleventh Aspect

In the molded package according to the eighth to tenth aspects, the lead includes a first lead and a second lead which are disposed so as to put the ceramic substrate therebetween in the first direction, and at least one of the first lead and the second lead being in contact with each of a pair of the opposed side surfaces of the ceramic substrate in a second direction perpendicular to the first direction to hold the ceramic substrate.

What is claimed is:

1. A light emitting device comprising:

a ceramic substrate including an upper surface with a rectangular shape, a lower surface with a rectangular shape, a first side surface, a second side surface opposed to the first side surface, a third side surface adjacent to the first and second side surfaces, and a fourth side surface opposed to the third side surface and being adjacent to the first and second side surfaces;

a first lead located on a side of the first side surface of the ceramic substrate, the first lead including a first extending portion and a second extending portion;

a second lead located on a side of the second side surface of the ceramic substrate, the second lead including a first extending portion and a second extending portion;

a molded resin molded so as to integrate with the ceramic substrate, the first lead and the second lead, wherein the upper surface of the ceramic substrate includes an exposed region exposed from the molded resin and a covered region covered with the molded resin, and wherein the lower surface of the ceramic substrate is wholly exposed from the molded resin; and at least one light emitting element located on the exposed region of the upper surface of the ceramic substrate, wherein the covered region of the upper surface of the ceramic substrate is located adjacent to the first, second and third side surfaces, wherein the first extending portion of the first lead is located along the fourth side surface of the ceramic substrate so as not to be in direct contact with a first non-contact part of the fourth side surface adjacent to the first side surface of the ceramic substrate, and an end of the first extending portion of the first lead is in direct contact with a first contact part of the fourth side surface spaced apart from the first side surface by the first non-contact part, a gap between the first extending portion of the first lead and the first non-contact part being filled with a part of the molded resin, wherein the first extending portion of the second lead is located along the fourth side surface of the ceramic substrate so as not to be in direct contact with a second non-contact part of the fourth side surface adjacent to the second side surface of the ceramic substrate, and an end of the first extending portion of the second lead is in direct contact with a second contact part of the fourth side surface spaced apart from the second side surface by the second non-contact part, a gap between the first extending portion of the second lead and the second non-contact part being filled with a part of the molded resin, and wherein the end of the first extending portion of the first lead and the end of the first extending portion of the second lead are exposed from the molded resin in a top view.

2. The light emitting device according to claim 1, wherein a remaining part of the fourth side surface located between the first and second contact parts is in contact with the molded resin.

3. The light emitting device according to claim 2, wherein the second extending portion of the first lead is located along the third side surface of the ceramic substrate so as not to be in direct contact with a third non-contact part of the third side surface adjacent to the first side surface of the ceramic substrate, and an end of the second extending portion of the first lead is in direct contact with a third contact part of the third side surface spaced apart from the first side surface by the third non-contact part, a gap between the second extending portion of the first lead and the third non-contact part being filled with a part of the molded resin, wherein the second extending portion of the second lead is located along the third side surface of the ceramic substrate so as not to be in direct contact with a fourth non-contact part of the third side surface adjacent to the second side surface of the ceramic substrate, and an end of the second extending portion of the second lead is in direct contact with a fourth contact part of the third side surface spaced apart from the second side surface by the fourth non-contact part, a gap between the second extending portion of the second lead and the fourth non-contact part being filled with a part of the molded resin.

4. The light emitting device according to claim 3, wherein the end of the second extending portion of the first lead and the end of the second extending portion of the second lead are covered with the molded resin in a top view.

5. The light emitting device according to claim 4, wherein a remaining part of the third side surface located between the third and fourth contact parts is in contact with the molded resin.

6. The light emitting device according to claim 5, wherein the ceramic substrate is held between the end of the first extending portion of the first lead and the end of the second extending portion of the first lead with elastic deformation of at least one of the first and second extending portions of the first lead.

7. The light emitting device according to claim 6, wherein the ceramic substrate is held between the end of the first extending portion of the second lead and the end of the second extending portion of the second lead with elastic deformation of at least one of the first and second extending portions of the second lead.

8. The light emitting device according to claim 7, wherein the first extending portion of the first lead is in contact with a fifth contact part of the first side surface adjacent to the fourth side surface, and the second extending portion of the first lead is in contact with a sixth contact part of the first side surface adjacent to the third side surface, the fifth contact part and the sixth contact part being apart from each other.

9. The light emitting device according to claim 8, wherein the first extending portion of the second lead is in contact with a seventh contact part of the second side surface adjacent to the fourth side surface, and the second extending portion of the second lead is in contact with an eighth contact part of the second side surface adjacent to the third side surface, the seventh contact part and the eighth contact part being apart from each other.

10. The light emitting device according to claim 9, wherein the ceramic substrate is formed from AlN.

11. A light emitting device comprising:

a ceramic substrate including an upper surface with a rectangular shape, a lower surface with a rectangular shape, a first side surface, a second side surface opposed to the first side surface, a third side surface adjacent to the first and second side surfaces, and a fourth side surface opposed to the third side surface and being adjacent to the first and second side surfaces;

a first lead located on a side of the first side surface of the ceramic substrate, the first lead including a first extending portion and a second extending portion;

a second lead located on a side of the second side surface of the ceramic substrate, the second lead including a first extending portion and a second extending portion;

a molded resin molded so as to integrate with the ceramic substrate, the first lead and the second lead, wherein the upper and lower surfaces of the ceramic substrate are wholly exposed from the molded resin; and at least one light emitting element located on the upper surface of the ceramic substrate, wherein the first extending portion of the first lead is located along the fourth side surface of the ceramic substrate so as not to be in direct contact with a first non-contact part of the fourth side surface adjacent to the first side surface of the ceramic substrate, and an end of the first extending portion of the first lead is in direct contact with a first contact part of the fourth side surface spaced apart from the first side surface by the first non-contact part, a gap between the first extending portion of the first lead and the first non-contact part being filled with a part of the molded resin, and wherein the first extending portion of the second lead is located along the fourth side surface of the ceramic substrate so as not to be in direct contact with a second non-contact part of the fourth side surface adjacent to the second side surface of the ceramic substrate, and an end of the first extending portion of the second lead is in direct contact with a second contact part of the fourth side surface spaced apart from the second side surface by the second non-contact part, a gap between the first extending portion of the second lead and the second non-contact part being filled with a part of the molded resin, wherein the second extending portion of the first lead is located along the third side surface of the ceramic substrate so as not to be in direct contact with a third non-contact part of the third side surface adjacent to the first side surface of the ceramic substrate, and an end of the second extending portion of the first lead is in direct contact with a third contact part of the third side surface spaced apart from the first side surface by the third non-contact part, a gap between the second extending portion of the first lead and the third non-contact part being filled with a part of the molded resin, wherein the second extending portion of the second lead is located along the third side surface of the ceramic substrate so as not to be in direct contact with a fourth non-contact part of the third side surface adjacent to the second side surface of the ceramic substrate, and an end of the second extending portion of the second lead is in direct contact with a fourth contact part of the third side surface spaced apart from the second side surface by the fourth non-contact part, a gap between the second extending portion of the second lead and the fourth non-contact part being filled with a part of the molded resin, and wherein the end of the first extending portion of the first lead, the end of the second extending portion of the first lead, the end of the first extending portion of the second lead and the end of the second extending portion of the second lead are exposed from the molded resin in a top view.

12. The light emitting device according to claim 11, wherein a remaining part of the fourth side surface located between the first and second contact parts is in contact with the molded resin.

13. The light emitting device according to claim 12, wherein a remaining part of the third side surface located between the third and fourth contact parts is in contact with the molded resin.

14. The light emitting device according to claim 13, wherein the ceramic substrate is held between the end of the first extending portion of the first lead and the end of the second extending portion of the first lead with elastic deformation of at least one of the first and second extending portions of the first lead.

15. The light emitting device according to claim 14, wherein the ceramic substrate is held between the end of the first extending portion of the second lead and the end of the second extending portion of the second lead with elastic deformation of at least one of the first and second extending portions of the second lead.

16. The light emitting device according to claim 15, wherein the first extending portion of the first lead is in contact with a fifth contact part of the first side surface adjacent to the fourth side surface, and the second extending portion of the first lead is in contact with a sixth contact part of the first side surface adjacent to the third side surface, the fifth contact part and the sixth contact part being apart from each other.

17. The light emitting device according to claim 16, wherein the first extending portion of the second lead is in contact with a seventh contact part of the second side surface adjacent to the fourth side surface, and the second extending portion of the second lead is in contact with an eighth contact part of the second side surface adjacent to the third side surface, the seventh contact part and the eighth contact part being apart from each other.

18. The light emitting device according to claim 17, wherein the ceramic substrate is formed from AlN.

* * * * *